(12) United States Patent
VanBuskirk et al.

(10) Patent No.: US 7,791,947 B2
(45) Date of Patent: Sep. 7, 2010

(54) NON-VOLATILE MEMORY DEVICE AND METHODS OF USING

(75) Inventors: Michael A. VanBuskirk, Saratoga, CA (US); Colin S. Bill, Cupertino, CA (US); Takao Akaogi, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 135 days.

(21) Appl. No.: 11/972,312

(22) Filed: Jan. 10, 2008

(65) Prior Publication Data

US 2009/0180330 A1 Jul. 16, 2009

(51) Int. Cl.
*G11C 16/04* (2006.01)

(52) U.S. Cl. .......................... 365/185.24; 365/185.17; 365/185.05; 365/185.18; 365/185.11

(58) Field of Classification Search ............ 365/185.24, 365/185.17, 185.05, 185.18, 185.11
See application file for complete search history.

(56) References Cited

U.S. PATENT DOCUMENTS

| | | | |
|---|---|---|---|
| 6,191,975 B1 * | 2/2001 | Shimizu et al. ........ | 365/185.17 |
| 6,411,548 B1 | 6/2002 | Sakui et al. | |
| 6,859,397 B2 * | 2/2005 | Lutze et al. ............ | 365/185.28 |
| 6,982,905 B2 * | 1/2006 | Nguyen ................. | 365/185.17 |
| 7,064,978 B2 * | 6/2006 | Lee et al. ............... | 365/185.01 |
| 7,092,294 B2 | 8/2006 | Sato et al. | |
| 7,372,736 B2 * | 5/2008 | Lee et al. ............... | 365/185.18 |
| 7,433,231 B2 * | 10/2008 | Aritome ................ | 365/185.17 |
| 2002/0010828 A1 | 1/2002 | Kuo et al. | |
| 2006/0113524 A1 | 6/2006 | Bill et al. | |
| 2008/0186765 A1 * | 8/2008 | Kamigaichi ............ | 365/185.05 |

FOREIGN PATENT DOCUMENTS

JP 11086471 A 3/1999

OTHER PUBLICATIONS

Brown, W.D. et al., "Nonvolatile Semiconductor Memory Technology: A Comprehensive Guide to Understanding and Using NVSM Devices," IEEE Press, New York, 1998, US 233960, XP002517136, 2 pages.
PCT/US2009/030182 International Search Report, Mar. 9, 2009, 5 pages.
US 7,161,836, 01/2007, Wan et al. (withdrawn)

* cited by examiner

*Primary Examiner*—Viet Q Nguyen

(57) ABSTRACT

The present disclosure adjusts the voltage threshold values of select gates of NAND strings. The select gates of the NAND string can be read, erased, and programmed.

20 Claims, 6 Drawing Sheets

| | | $V_{BL}$ AT SELECTED ROW (V) | $V_{SDG}$ AT SELECTED ROW(s) (V) | $V_{SDG}$ AT UNSELECTED ROW(s) (V) | NAND WLs (V) | $V_{SSG}$ AT SELECTED NAND STRING OF BL (V) | $V_{SSG}$ AT UNSELECTED NAND STRING OF BL (V) | $V_{WELL}$ (V) | $V_{CS}$ (V) |
|---|---|---|---|---|---|---|---|---|---|
| 411 | READ SDG | $V_{PC}$ (0.1-3) | $V_{RD}$ (<3) | $V_{OFF}$ (0) | $V_{PASS,WL}$ (6-8) | $V_{PASS,SG}$ (5-10) | $V_{OFF}$ (0) | GND | GND |
| 412 | READ SSG | $V_{PC}$ (0.1-3) | $V_{PASS,SG}$ (5-10) | $V_{OFF}$ (0) | $V_{PASS,WL}$ (6-8) | VRD (<3) | $V_{OFF}$ (0) | GND | GND |
| 413 | ERASE SDG | Z | GND | Z | Z | Z | Z | $V_{ERASE,SG}$ (15-18) | Z |
| 414 | ERASE SSG | Z | Z | Z | Z | GND | Z | $V_{ERASE,SG}$ (15-18) | Z |
| 415 PGM SDGs | SELECTED BL OF SELECTED ROW (PGM) | GND | $V_{PGM,DG}$ (15-18) | GND | $V_{PASS,WL}$ (10) | GND | GND | GND | 1.8 | (4151) |
| | UNSELECTED BL OF SELECTED ROW (PGM) | 4 (3-7) | $V_{PGM,DG}$ (15-18) | GND | $V_{PASS,WL}$ (10) | GND | GND | GND | 1.8 | (4152) |
| 416 PGM SSG | ALL SELECTED | 0 | $V_{PASS,DG}$ (5-10) | $V_{PASS,DG}$ (5-10) | $V_{PASS,WL}$ (10) | $V_{PGM,SG}$ (15-18) | $V_{PASS,SG}$ (5-10) | GND | 0 |

| | $V_{BL}$ AT SELECTED ROW (V) 421 | $V_{SDG}$ AT SELECTED ROW(s) (V) 422 | $V_{SDG}$ AT UNSELECTED ROW(s) (V) 423 | NAND WLs (V) 424 | $V_{SSG}$ AT SELECTED NAND STRING OF BL (V) 425 | $V_{SSG}$ AT UNSELECTED NAND STRING OF BL (V) 426 | $V_{WELL}$ (V) 427 | $V_{CS}$ (V) 428 |
|---|---|---|---|---|---|---|---|---|
| READ SDG 411 | $V_{PC}$ (0.1-3) | $V_{RD}$ (<3) | $V_{OFF}$ (0) | $V_{PASS,WL}$ (6-8) | $V_{PASS,SG}$ (5-10) | $V_{OFF}$ (0) | GND | GND |
| READ SSG 412 | $V_{PC}$ (0.1-3) | $V_{PASS,SG}$ (5-10) | $V_{OFF}$ (0) | $V_{PASS,WL}$ (6-8) | $V_{RD}$ (<3) | $V_{OFF}$ (0) | GND | GND |
| ERASE SDG 413 | Z | GND | Z | Z | Z | Z | $V_{ERASE,SG}$ (15-18) | Z |
| ERASE SSG 414 | Z | Z | Z | Z | GND | Z | $V_{ERASE,SG}$ (15-18) | Z |
| SELECTED BL OF SELECTED ROW (PGM) 415 | GND | $V_{PGM,DG}$ (15-18) | GND | $V_{PASS,WL}$ (10) | GND | GND | GND | 1.8 |
| UNSELECTED BL OF SELECTED ROW (PGM) | 4 (3-7) | $V_{PGM,DG}$ (15-18) | GND | $V_{PASS,WL}$ (10) | GND | GND | GND | 1.8 |
| PGM SDGs ALL SELECTED 416 | 0 | $V_{PASS,DG}$ (5-10) | $V_{PASS,DG}$ (5-10) | $V_{PASS,WL}$ (10) | $V_{PGM,SG}$ (15-18) | $V_{PASS,SG}$ (5-10) | GND | 0 |
| PGM SSG | | | | | | | | |

*FIG. 4*

NON-VOLATILE MEMORY DEVICE AND METHODS OF USING

BACKGROUND

1. Field of the Disclosure

The present disclosure relates generally to electronic devices and more particularly to electronic devices including non-volatile memory.

2. Description of the Related Art

One type of non-volatile memory, referred to as a NAND flash memory, uses a plurality of NAND strings that are arranged in rows and columns. Each NAND string includes a plurality of transistors that include a string of serially connected NAND storage cells connected in series with a select gate at the top and a select gate at the bottom of the string of NAND storage cells. In a typical NAND flash memory there are a plurality of local bit lines. Each one of the plurality of local bit lines is connected to a respective one of a plurality of NAND strings. Information stored at an individual NAND storage cell of a specific NAND string can be accessed through the individual storage cell's corresponding local bit line, i.e., its column, by applying appropriate control signals to the NAND string. For example, a select gate of a NAND string during a memory read operation can be turned on to electrically connect the NAND storage cells of the NAND string to its corresponding bit line, thereby allowing one of the plurality of NAND storage cells of the NAND string to be read during a read operation. However, as the geometries of transistors used to form the select gates of the NAND strings are scaled to smaller dimensions, the fabrication process used to form the select gates, which can be similar to the process used to form the NAND storage cells, can vary significantly enough to cause a wide range of threshold voltages ("Vts") between select gates. A wide range of Vts between select gates can make it difficult to find a suitable window of operation to assure that each select gate of each NAND string is appropriately controlled during access operations.

BRIEF DESCRIPTION OF THE DRAWINGS

The present disclosure may be better understood, and its numerous features and advantages made apparent to those skilled in the art by referencing the accompanying drawings.

FIG. 4 includes a table indicating signals used to perform various operations in accordance with the present disclosure;

DETAILED DESCRIPTION

Figure 1:
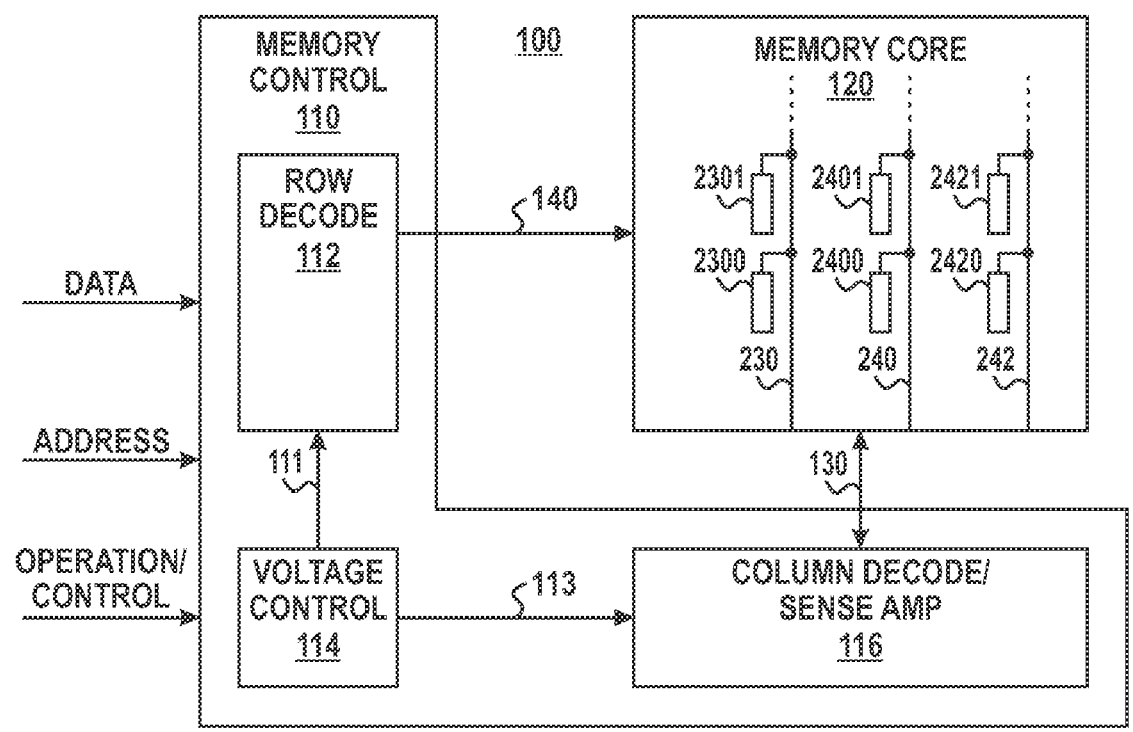
FIG. 1 is a block diagram of an electronic device having non-volatile memory in accordance with a specific embodiment of the present disclosure.

FIG. 1 illustrates an electronic device 100 in accordance with a specific embodiment of the present disclosure. Electronic device 100 can include a memory module that includes one or more integrated circuits that include a memory control module 110 connected to a memory core 120 by a set of column interconnects 130 and a set of row interconnects 140. Though not specifically illustrated, electronic device 100 can include additional modules, such as a data processor, which can be a general-purpose data processor or a custom data processor.

Memory control module 110 includes a row decode module 112 connected to the set of row interconnects 140, a column decode/sense amp module 116 connected to the set of column interconnects 130, and a voltage control module 114 connected to the row decode module 112 and the column decode module/sense amp module 116 through interconnects 111 and 113.

Memory core 120 includes a plurality of bit lines that delineate columns of NAND strings within memory core 120, including bit line 230, bit line 240, and bit line 242. Each bit line of the plurality of bit lines has a plurality of NAND strings connected thereto. For example, NAND strings 2300 and 2301 are connected to bit line 230, NAND strings 2400 and 2401 are connected to bit line 240, and NAND strings 2420 and 2421 are connected to bit line 242.

During operation, the row decode module 112 receives and decodes signals labeled OPERATION/CONTROL, and ADDRESS, to determine the output signals to be provided at row interconnects 140 for each NAND string of the memory core 120. Similarly, the column decode module 116 decodes signals OPERATION/CONTROL, ADDRESS, and DATA, to determine the output signals to be provided at column interconnects 130 for each bit line of the memory core 120. Based upon an operation being performed, the voltage control module 114 provides appropriate voltages to the row decode module 112 and to the column decode/sense amp module 116. In accordance with a specific aspect of the present disclosure, memory control module 110 can perform read, write, and erase operations at NAND storage cells, which are also referred to as NAND storage gates, and at the select gates of memory core 120 as described in further detail herein.

Figure 2:
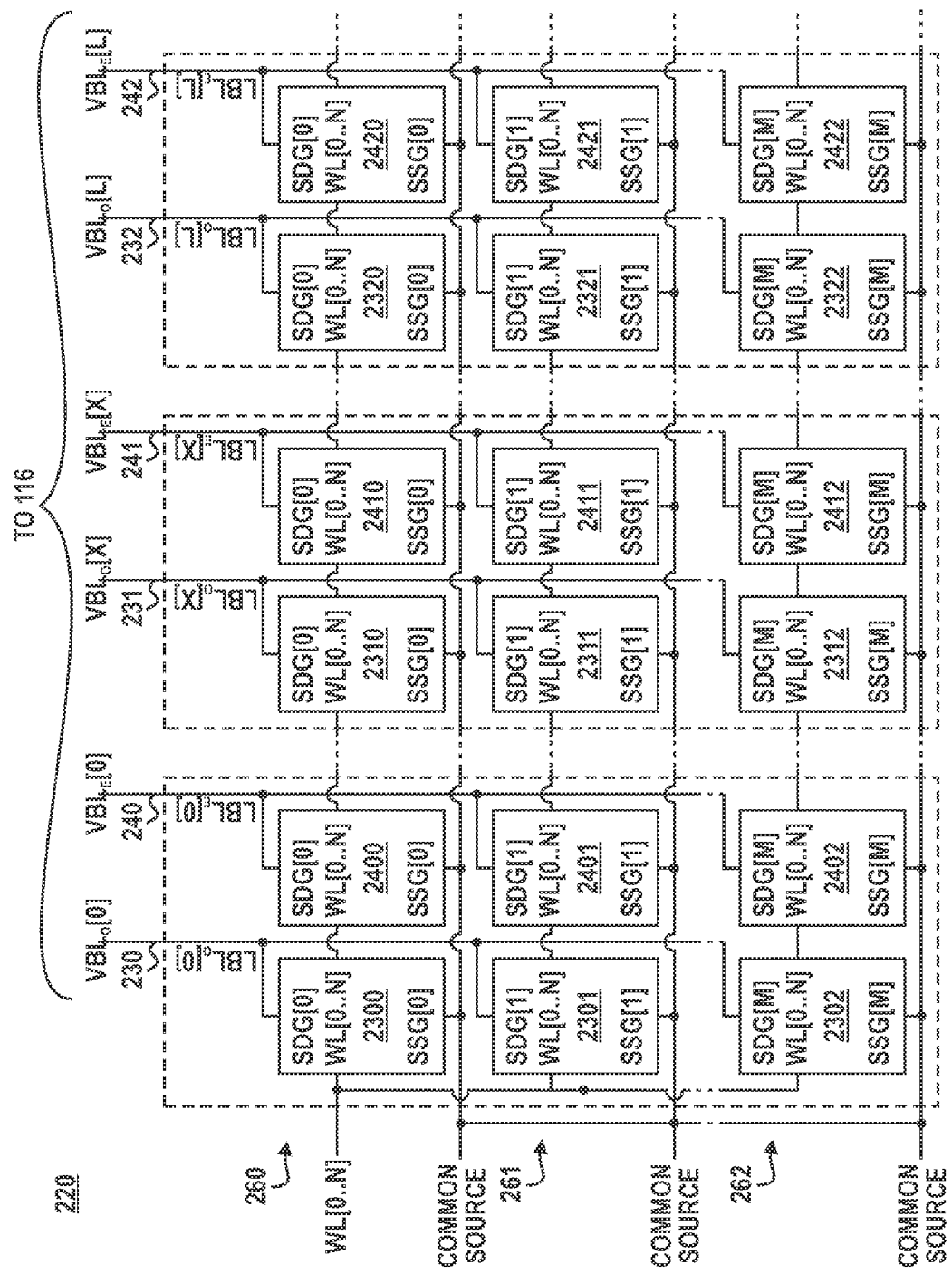
FIG. 2 includes a more detailed view of a specific embodiment of a memory core in accordance with a specific embodiment of the present disclosure.

FIG. 2 illustrates a memory core 220 having a plurality of NAND strings organized into a plurality of rows and columns that are representative of a specific embodiment of memory core that can represent memory core 120 of in FIG. 1. Each one of the plurality of NAND strings illustrated at FIG. 2 is connected to word lines WL[0 . . . N] of row interconnects 140, where N is an integer indicating the number of storage cells at each NAND string. Rows of NAND strings within memory core 220 are defined by sets of NAND strings, with each NAND string within a common row being connected to a common pair of select gate signals. For example, interconnects 140 include select gate nodes SDG [0 . . . M] and SSG [0 . . . M], where NAND strings 2300, 2310, 2320, 2400, 2410, and 2420 are associated with a row 260 since they are each connected to a common set of select gate nodes, SDG[0] and SSG[0]. NAND strings 2301, 2311, 2321, 2401, 2411, and 2421 are associate with a row 261 since they are each connected to a common set of select gate nodes, SDG[1] and SSG[1]. NAND strings 2302, 2312, 2322, 2402, 2412 are associated with a row 262 since they are each connected to a common set of select gate nodes SDG[M] and SSG[M], where M is an integer indicating the number of NAND strings connected to a bit line. Rows of storage cells within each row of NAND strings are connected to a common word line.

The columns of memory core 220 correspond to a plurality of local bit line pairs, where each local bit line pair includes an even and odd local bit line connected to interconnects labeled $LBL_O[0-L]$ and $LBL_E[0-L]$ of the column interconnects 130, where L is an integer indicating the number of local bit line pairs at memory core 120. NAND strings, and their respective storage cells, coupled to a common local bit line are referred to as being in the same column.

Each one of the plurality of even and odd local bit lines are connected to a unique plurality of NAND strings—one NAND string from each row. For example, odd bit line $LBL_O$[0] is connected to M NAND strings 2300-2302, even bit line $LBL_E$[0] is connected to M NAND strings 2400-2402, odd bit line $LBL_O$[1] is connected to M NAND strings 2310-2312, even bit line $LBL_E$[1] is connected to M NAND strings 2410-2412, and so one, where M is an integer indicating the number of NAND strings attached to each bit line.

Figure 3:
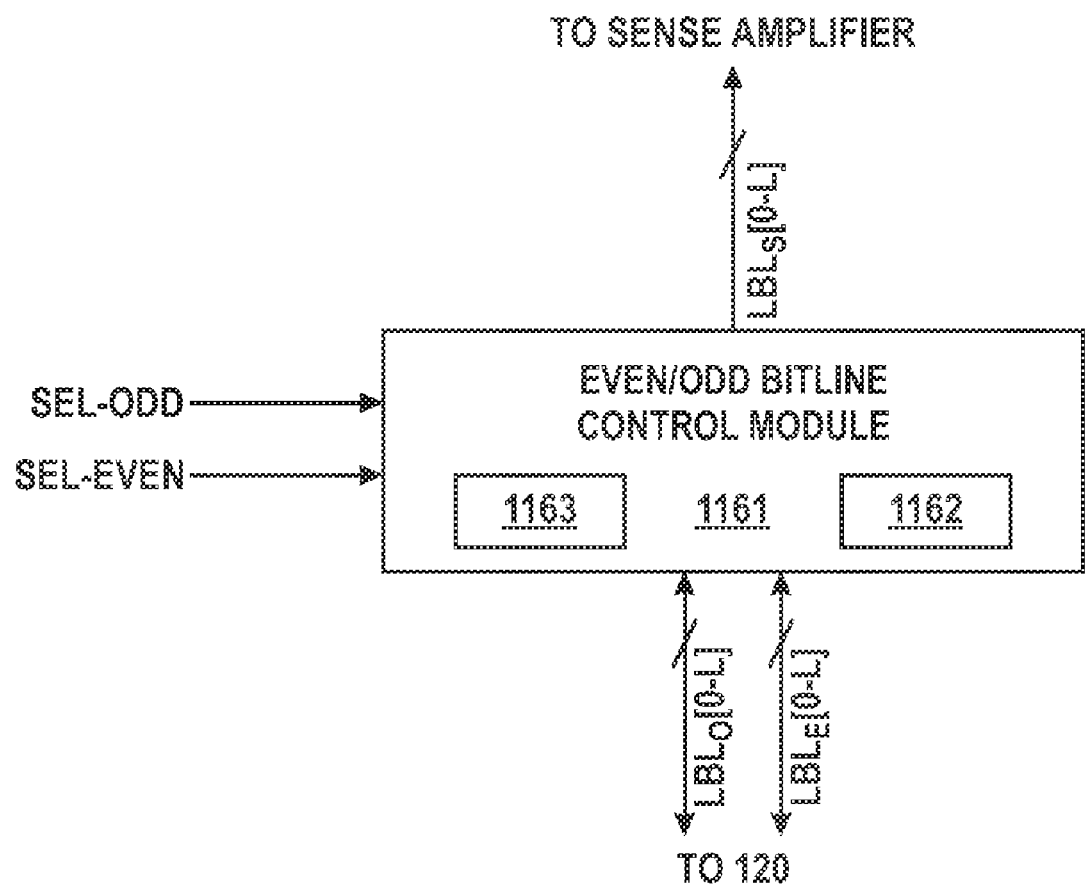
FIG. 3 includes a more detailed view of particular embodiment of a portion of a column decoder of FIG. 1.

FIG. 3 illustrates an even/odd bit line control module 1161 that is a portion of column decode/sense amp module 116 connected to select nodes SEL_EVEN and SEL_ODD. Even/odd bit line control module 1161 includes a bit line select module 1163 and a bit line bias module 1162. The bit line select module 1163 is that portion of the column decode/sense amp module 116 used to select one of an even bit line or an odd bit line for a specific operation. The bit line bias module 1162 is that portion of the column decode/sense amp module 116 that interfaces with the voltage control module 114 to provide appropriate bias signals (Vbl[0-L], e.g., voltages) to the bit lines of the memory core 120 during read, erase, and program operations. Bit line bias module 1162 can include a signal select module of the type discussed at FIG. 7.

In addition to being capable of accessing storage cells of memory core 120 during a read, program, and erase operations, the plurality of row interconnects 140 and the plurality of column interconnects 130 can also be controlled to access the select gates of NAND strings during read, program, and erase operations as further described below.

Figure 5:
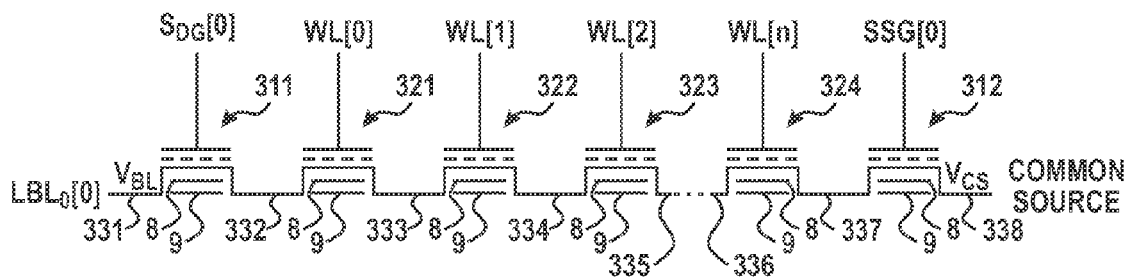
FIG. 5 includes a circuit diagram of a NAND string in accordance with a particular embodiment of the present disclosure.

FIG. 4 includes a table that indicates signal values used to perform various operations on select gates of memory core 120. FIG. 5 illustrates a schematic representation of NAND string 2300, which is representative of each NAND string of memory core 120, and includes transistors 311, 312, and 321-324. Each of the transistors 311, 312, and 321-324 are N-channel transistors formed within a common P-well, represented by features 8 at FIG. 5, that is formed within a common N-well, which is represented by features 9 at FIG. 5. Transistors 321-324 represent a string of NAND storage cells, also referred to as storage cells NAND[0 ... N], whereby NAND storage cells [0-N] form a string of NAND storage cells, while transistors 311 and 312 represent select gates. Storage cell NAND[0], i.e., transistor 321, and storage cell NAND[N], i.e., transistor 324, represent the two outer NAND storage cells of the string of NAND storage cells, while storage cells NAND[1 ... N-1] represent the interior storage cells of the string of NAND storage cells. The storage cell NAND[0] is the NAND storage cell of the sting of NAND storage cells most closely coupled to the local bit line interconnect $LBL_O$[0]. The storage cell NAND[N] is the NAND storage cell of the string of NAND storage cells least closely coupled to the local bit line interconnect $LBL_O$[0].

Transistor 311 has a source/drain electrode 331 connected to local bit line interconnect $LBL_O$[0] of interconnects 140 and a source/drain electrode 332 that is shared with transistor 321. Source/drain electrode 333 is shared by transistor 321 and transistor 322. Source/drain electrode 334 is shared by transistor 322 and transistor 323. Source/drain electrode 335 is shared by transistor 323 and an adjacent transistor that is not illustrated 322. Source/drain electrode 336 is shared by an adjacent transistor that is not illustrated and transistor 324. Source/drain electrode 337 is shared by transistor 324 and transistor 312. Transistor 312 has a source/drain electrode 338 connected to the common source interconnect.

Transistor 311 is referred to as a select drain gate, and operates as a select gate that can electrically connect the local bit line interconnect $LBL_O$[0] to the string of NAND storage cells formed by transistors 321-324. It is noted that the term "select drain gate" does not imply that the voltage Vbl at a local bit line interconnect $LBL_O$[0] is always greater than a voltage at the common source interconnect during operation.

Transistor 312 is referred to as a select source gate, and operates as a select gate that electrically connects the common source interconnect, Vcs, to the NAND storage string formed by transistors 321-324. It is noted that the term select source gate does not imply that voltage Vcs at the common source interconnect is always less than the voltage Vbl at the local bit line interconnect $LBL_O$[0] during operation.

Referring back to the table of FIG. 4, rows 411-416 correspond to various operations that can be performed on a select gate of a NAND string. Row 411 indicates signal values used to bias the NAND string of FIG. 5 during an operation that reads the select drain gates of a selected row, such as transistor 311. Row 412 indicates signal values used to bias the NAND string of FIG. 5 during an operation that reads the select source gates of a selected row, such as transistor 325. Row 413 indicates signal values used to bias the NAND string of FIG. 5 during an erase operation that adjusts the voltage threshold of a select drain gate, such as transistor 311, to a lower voltage. Row 414 indicates signal values used to bias the NAND string of FIG. 5 during an erase operation that adjusts the voltage threshold of a select source gate, such as transistor 312, to a lower voltage. Row 415 indicates signal values used to bias the NAND string of FIG. 5 during a program operation that adjusts the voltage threshold of the select drain gate of a selected row, such as transistor 311, to a higher voltage. Sub-row 4151 indicates signal values used at NAND strings of a selected row having a select drain gate to be programmed, whereby a bit line connected to a select drain gate to be programmed is said to be selected. Sub-row 4152 indicates signal values used at bit lines connected to those NAND strings of the selected row having a select drain gate that are not to be programmed, whereby a bit line connected to a select drain gate not to be programmed is said to be unselected. Row 416 indicates signal values used to bias the NAND string of FIG. 5 during a program operation that adjusts the voltage threshold of a select source gate, such as transistor 312, of a selected row to a higher voltage.

Cells of rows 411-416, which correspond to columns 421-428, contain values of signals used to perform each row's respective operation. Cells of Column 421 indicate bit line voltage values (Vbl) provided to a local bit lines during the operations indicated at the first column of rows 411-416. Cells of Column 422 indicate select drain gate voltages ($V_{SDG}$) provided to NAND strings along the row(s) selected for the operation indicated at the first column. Cells of Column 423 indicate select drain gate voltages ($V_{SDG}$) provided to NAND strings along the row(s) not selected for the operation indicated at the first column. Cells of column 424 indicate a word line voltage $V_{WL}$ provided to each of the word lines WL[0 ... N] during the operations indicated at the first column of rows 411-416. Cells of Column 425 indicate select source gate voltages ($V_{SSG}$) provided to NAND strings along the row(s) selected for the operation indicated at the first column. Cells of Column 426 indicate select source gate voltages ($V_{SSG}$) provided to NAND strings along the row(s) not selected for the operation indicated at the first column of rows 411-416. Cells of column 427 indicate a well bias voltage ($V_{WELL}$) provided to the well substrate of NAND strings during the operations indicated at the first column of rows 411-416. Cells of column 428 indicate a common source voltage (Vcs) provided to the common source interconnect during the operation indicated at the first column of rows 411-416. As used herein, the term "providing a voltage" as applied to an interconnect includes allowing the interconnect to float, i.e., placing the interconnect in a high impedance state (Z). Therefore, when a voltage is said to be "set to a high impedance state Z" it will be understood that a corresponding interconnect has been placed at a high impedance state.

In a specific embodiment, transistors 311, 312, and 321-324 are polysilicon gate N-type transistors formed from a common active region.

Referring to row 411 of the table of FIG. 4, a select gate, such as a select drain gate connected to interconnect SDG[0], can be read by determining if a voltage threshold of the select drain gate is above or below a read voltage (Vrd) as follows: set Vbl precharge voltage (Vpc) to a value in the range of less than three such as at approximately 1 volt; set Vcs and $V_{WELL}$ to ground; set a voltage at each word line to a pass voltage ($V_{Pass,WL}$) in the range of 6-8 volts such as 8 volts, to turn on each of the transistors 321-325, thereby allowing current to pass; set $V_{SSG}$ at the selected row to a pass voltage ($V_{Pass,SG}$) in the range of 5-7 volts such as 5 volts, to turn on transistor 312, thereby allowing current to pass; set $V_{SSG}$ at the unselected rows to an off voltage ($V_{OFF}$), such as ground that turns off transistor 312, thereby preventing current from passing through the unselected NAND strings; set $V_{SDG}$ at the selected row, e.g., at interconnect SDG$_O$[0], to a read voltage (Vrd) that is selected to determine whether voltage a threshold voltage (Vth) of the select drain gate is greater than or less than Vrd; set $V_{SDG}$ of the unselected rows, e.g., at interconnects SDG [1-M], to an off voltage $V_{OFF}$ that turns off select drain gates, thereby preventing current from passing through the unselected NAND strings; and set the well voltage ($V_{WELL}$) to ground.

Row 411 indicates signal values used to bias a NAND string during a read access operation that reads a value based upon charge stored at a select drain gate. A voltage difference across the string of NAND storage cells being read, i.e., between the local bit line and the common source, is set to a precharge voltage Vpc, such as approximately 1 volt, or to another value capable of being sensed when discharged during a read operation. A voltage is provided to the gate of each one of the storage gates and to the select source gate of the selected NAND string to ensure they are turned on in a manner so as not to interfere with current flow through the select drain gate being read. A voltage $V_{OFF}$ is provided to the gate of each select source gate and drain select gate of the other NAND strings connected to the same local bit line to ensure they are turned off in a manner so as not to interfere with current flow through the select drain gate being read that is connected to the same bit line. The well voltage is biased to ground, or other nominal bias voltage. The read voltage Vrd is selected to determine whether a threshold voltage (Vth) of the select drain gate being read, such as transistor 3 11, along a selected row is greater than or less than the read voltage Vrd. A single read of a select drain gate will provide a binary value indicating whether Vrd was sufficient to turn on the select drain gate.

Row 412 indicates signal values used to bias a NAND string during a read access operation that reads a logic value based upon a charge stored at a select source gate. The voltages at row 412 are the same as the voltages at row 411, where a select drain gate is being read, except that as indicated at column 422 of row 412 the voltage $V_{SDG}$ is set the voltage $V_{PASS,SG}$ and as indicated at column 425 the voltage $V_{SSG}$ at selected NAND strings of the bit line are set the read voltage Vrd.

Figure 6:
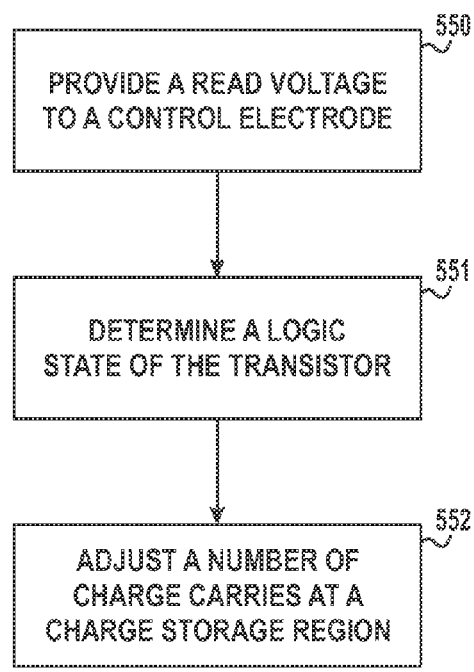
FIG. 6 includes a flow diagram in accordance with a specific embodiment of the present disclosure.

FIG. 6 illustrates a method whereby at block 550 a read voltage is provide to a control electrode of a select gate of a NAND string, such as at the control electrode of transistor 311. At block 551, a logic state of the select gate is determined at a sense amplifier, i.e., read, to determine if the voltage threshold of the select gate is above or below the read voltage, based upon a binary value provided by the sense amplifier.

At block 552, the number of charge carriers at a charge storage region of the select gate can be adjusted, by a program or erase, in response to the binary value being at a first state. For example, the number of electrons at the charge storage region can be reduced in response to a non-conductive or high voltage logic state being read due to insufficient current flowing through the select gate when a conductive or low voltage logic state was expected. Alternatively, the number of electrons at the charge storage region can be increased in response to a conductive or low voltage logic state being read due to too much current flowing through the select gate when a non-conductive or high voltage logic value was expected. Note the term "high voltage logic state" is intended to refer to the logic state represented by a more positive voltage on a bit line in a system that senses voltage, and the term "low voltage logic state" is intended to refer to the logic state represented by a less positive signal on the bit line. For example, the term "high voltage logic value" would be 2.5 volts in a system where a voltage of 2.5 volts or greater represents one logic state, which can be either a High-level (H) or Low-level (L) logic state. Similarly, the term "low voltage logic value" would be 0 volts in a system where a voltage of zero volts or less represents the other logic state. The term "non-conductive logic state" is intended to refer to the logic state represented when substantially no current is allowed to pass through a bit line during a read operation in a system that senses current, and the term "conductive logic state" is intended to refer to the logic state represented when current is allowed to pass through a bit line during a read operation.

The number of charge carriers used to adjust the voltage threshold can be incrementally adjusted and blocks 550-502 repeated until a desired logic value is read at the select gate that indicates the select gate has a desired Vt. Alternatively, the blocks 550 and 551 can be repeated to continuously or incrementally modify the read voltage while monitoring an output of the sense amplifier for the proper logic state, at which time the voltage threshold of the select drain gate is known to a desired precision. In this manner, once the Vt is known, the number of charge carriers can be modified during a single program or erase operation by adjusting the duration of the program or erase cycle.

Referring to row 413 of the table of FIG. 4, all select drain gates along a row can have their voltage threshold adjusted by an erase operation as follows: set Vbl at each bit line to a high impedance state Z; set Vcs to a high impedance state; set $V_{WL}$ for each word line to a high impedance state; set $V_{SSG}$ at each bit line to a high impedance state Z; set $V_{SDG}$ to ground at rows where select drain gates are to be erased; set $V_{SDG}$ to a high impedance state Z at rows where select drain gates are not to be erased; and set $V_{WELL}$ to an erase voltage $V_{ERASE,SG}$, which can be in the range of 15-21 volts, which includes a range of 15-18 volts.

Erasing in this manner adjusts the voltage threshold of all select drain gates within a selected row, such as transistor 311, by creating a sufficiently large electric field across a dielectric layer that resides between a charge storage region of transistor 311 and its channel to allow charge carriers to cross the dielectric layer. As a result, a relative number of primary charge carriers is reduced at the charge storage region. For example, electrons are the primary charge carriers for the N-channel transistors, and holes are the primary carrier for P-channel transistors. Therefore, for N-channel transistors, the relative number of electrons is increased at the charge storage region as compared to positively charged "holes" stored at the charge storage region. This results in transistor 311 having a voltage threshold closer to ground. For example, the number of electrons (charge carriers) stored at the charge storage region of transistor 311 is less after erasing relative the number of holes at the charge storage region than it was before erasing, thereby adjusting the voltage threshold of transistor 311 to be closer to ground. It will be appreciated that other voltage values than those listed in the table of FIG. 4 can be used to create the electric field necessary to erase the select drain gate. Signals at multiple select drain gate interconnects, SDG[0-M], can be simultaneously erased by placing them at ground simultaneously.

Referring to row 414 of the table of FIG. 4, all select source gates along a row can have their voltage threshold adjusted by an erase operation as follows: set Vbl of each bit line to a high impedance state Z; set Vcs to a high impedance state; set $V_{WL}$ for each word line to a high impedance state; set $V_{SDG}$ of each bit line to a high impedance state Z; set $V_{SSG}$ to ground at rows where select source gates are to be erased; set $V_{SSG}$ to a high impedance state Z at rows where select source gates are not to be erased; and set $V_{WELL}$ to an erase voltage $V_{ERASE,SG}$, which can be in the range of 15-21 volts, which includes a range of 15-18 volts.

Applying the voltages indicated at row 414 adjusts the voltage threshold of all select source gates within a selected row, such as transistor 312, by creating a sufficiently large electric field across a dielectric layer that resides between a charge storage region and the channel of the select source gates, in a manner similar to that previously described for select drain gates. Therefore, the relative number of electrons (charge carriers) stored at the charge storage region of transistor 312 is reduced by the erase operation, thereby adjusting the voltage threshold of transistor 312 to be closer to ground. It will be appreciated that other voltage values can be used to create the large electric field necessary to erase the select drain gate. Signals at multiple select source gate interconnects, SSG[0-M], can be simultaneously erased by placing them at ground simultaneously.

A row of NAND strings can have its select drain gates and select source gates simultaneously erased by driving the select source gate interconnect and the select drain gate interconnect of the row of NAND strings to ground simultaneously.

Referring to row 415 of the table of FIG. 4, one or more select drain gates of a selected row of NAND strings can have its voltage threshold adjusted by a program operation, while the voltage thresholds of other select drain gates along the selected row of NAND strings, and unselected row of NAND strings, remain unaffected, as follows: set $V_{SDG}$ of the row of selected NAND strings, i.e., the row of NAND strings containing select drain gates to be programmed, to a programming voltage ($V_{PGM, DG}$) in the range of 15-21 volts, which includes approximately 15-18 volts; set $V_{SDG}$ of the rows of unselected NAND strings, i.e., the rows of NAND strings that do not contain any select drain gates to be programmed, to 0 volts; set Vbl to ground at local bit lines that are connected to select drain gates that are to be programmed along the row of selected NAND strings (see sub-row 4151); set Vbl to a voltage in the range of 3-7 volts such as approximately 4 volts, at local bit lines connected to select drain gates of the selected row of NAND string that are not to be programmed (see sub-row 4142); set $V_{WL}$ for each word line to a high impedance state Z; set Vcs to a voltage in the range of 0-3 Volts such as approximately 1.8 volts; set $V_{SSG}$ to ground for all selected and unselected rows of NAND strings.

Programming in this manner adjusts the voltage threshold of selected select drain gates, such as transistor 311, within a selected row of NAND string by creating a sufficiently large electric field across a dielectric layer of the select drain gate that resides between a charge storage region and the channel of the select drain gate to allow charge carriers to cross the dielectric layer. With respect to an N-type select drain gate, such as transistor 311, this electric field results in an increase in the relative number of charge carriers at the charge storage region of the transistor 311. For example, the relative number of electrons (charge carriers) stored at the charge storage region of transistor 311 is increased during a program operation, thereby adjusting the voltage threshold of transistor 311 to be further from ground. It will be appreciated that other voltage values can be used to create the electric field necessary to program the select drain gate.

Referring to row 416 of the table of FIG. 4, all select source gates of a selected row of NAND strings can have their Vts adjusted simultaneously by a program operation as follows: set $V_{WELL}$ to ground; set Vbl to ground at each bit line connected to a select source gate to be programmed along the selected row NAND strings; set $V_{WL}$ to $V_{PASS,WL}$ for each word line; set Vcs to approximately ground; set $V_{SDG}$ at all selected and unselected rows of NAND string to $V_{PASS,DG}$; set $V_{SSG}$ at the select source gate of the selected row of NAND strings to a programming voltage $V_{PGM,SG}$ that is in the range of 15 volts to 18 volts; set $V_{SSG}$ at the unselected rows of select source gates to $V_{PASS,SG}$ to prevent the un-selected source gates from being programmed.

Programming in this manner adjusts the voltage thresholds of select source gates, such as transistor 312, within a selected row of NAND gates by creating a sufficiently large electric field across a dielectric layer that resides between a charge storage region and the channel of the select source gates. With respect to an N-type select source gate, such as transistor 312, this electric field results in an increase in the relative number of charge carriers at the charge storage region of the transistor 312. For example, the relative number of electrons (charge carriers) stored at the charge storage region of transistor 312 is increased during a program operation, thereby adjusting the voltage threshold of transistor 312 to be further from ground. It will be appreciated that other voltage values can be used to create the large electric field necessary to erase the select source gates.

Figure 7:
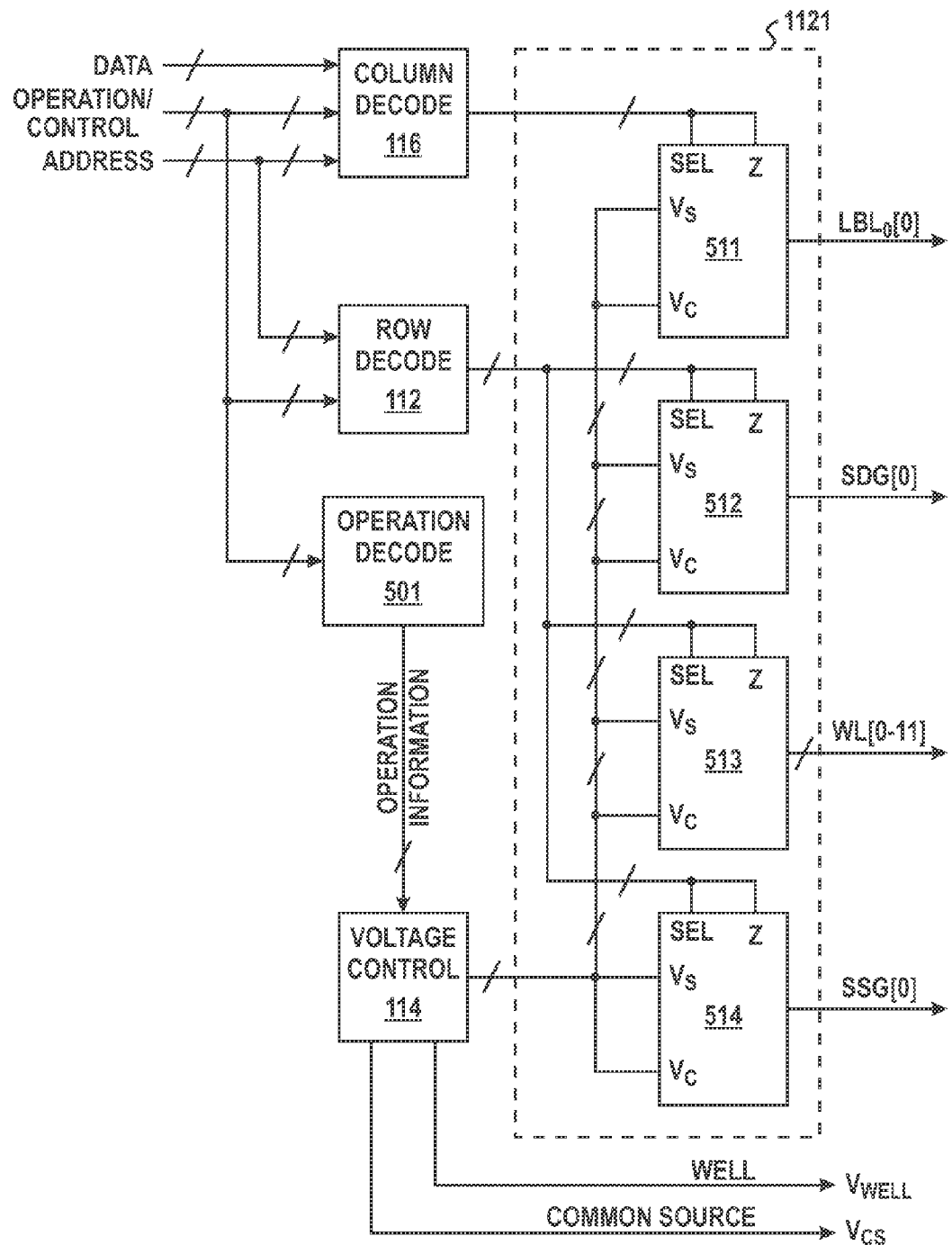
FIG. 7 includes a block diagram illustrating a portion of FIG. 1 in greater detail in accordance with a specific embodiment of the present disclosure.

FIG. 7 illustrates a block diagram of portions of memory control 110 used to drive various interconnects of NAND string 2300 of FIG. 5. The OPERATION/CONTROL signal and the ADDRESS signal are decoded by operation decode module 501, which provides operation information to voltage control module 114. In response to receiving the operation information, the voltage control module 114 will generate and provide the voltage levels used by the indicated operation to signal select module 1121. Note with respect to FIG. 1, portions of the signal select module can reside within the column decode module 116 and the row decode module 112, though not specifically illustrated as such at FIG. 7. When the operation decode module determines that an indicated operation is to be performed at a select gate of the memory core 120, the voltage control module 114 will provide voltages to a plurality of signal select sub-modules that are further controlled by the column decode module 116 and the column decode module 112 to drive specific outputs of the signal select module 1121 that bias the NAND strings, such as NAND string 2300, of FIG. 5 to perform the indicated operation.

Each local bit line interconnect is driven by a corresponding output of signal select module 1121. For example, bit line interconnect $LBL_O[0]$ is driven by signal select sub-module 511. Each signal select sub-module that drives a local bit line interconnect receives two voltage signals from voltage control module 114. A voltage signal received at input Vs is used to drive selected local bit lines, for example signal select sub-module 511 drives interconnect $LBL_O[0]$ when the bit line of NAND string 2300 is selected. A voltage signal received at input Vu is used to drive unselected local bit lines, for example signal select sub-module 511 drives interconnect $LBL_O[0]$ when the bit line of NAND string 2300 is unselected. If only one voltage signal is needed for an indicated operation, the needed signal can be provided to input Vs, and an unused signal, such as ground, can be provided to the input Vu.

Each select drain gate interconnect is driven by a corresponding signal select module. For example, select drain gate interconnect SDG[0] is driven by signal select sub-module 512. Each signal select sub-module that drives a select drain gate interconnect receives two voltage signals from voltage control module 114. A voltage signal received at input Vs is used to drive selected select drain gates, for example signal select sub-module 511 drives interconnect SDG[0] when the select drain gate of NAND string 2300 is selected. A voltage signal received at input Vu is used to drive unselected select drain gates, for example signal select sub-module 512 drives interconnect SDG[0] when the select drain gate of NAND string 2300 is unselected. If only one voltage signal is needed for an indicated operation, the needed signal can be provided to input Vs, and an unused signal, such as ground, can be provided to the input Vu.

Each word line interconnect is driven by a corresponding signal select sub-module. For example, word line interconnects WL[0-N] are driven by a plurality of signal select sub-modules 513. Each signal select sub-module that drives a select drain gate interconnect receives two voltage signals from voltage control sub-module 114. A voltage signal received at input Vs is used to drive selected word lines, for example signal select sub-module 513 drives all interconnects WL[0-N] to a pass voltage $V_{PASS,WL}$ when an operation affects a select gate of memory core 120. A voltage signal received at input Vu is used to drive unselected word lines during operations that affect storage cells of memory core 120. If only one voltage signal is needed for an indicated operation, the needed signal can be provided to input Vs, and an unused signal, such as ground, can be provided to the input Vu.

Each select source gate interconnect is driven by a corresponding signal select sub-module. For example, select source gate interconnect SSG[0] is driven by signal select module 514. Each signal select sub-module that drives a select source gate interconnect receives two voltage signals from voltage control module 114. A voltage signal received at input Vs is used to drive selected select source gates, for example signal select sub-module 511 drives interconnect SSG[0] when the select source gate of NAND string 2300 is selected. A voltage signal received at input Vu is used to drive unselected select source gates, for example signal select sub-module 512 drives interconnect SDG[0] when the select drain gate of NAND string 2300 is unselected. If only one voltage signal is needed for an indicated operation, the needed signal can be provided to input Vs, and an unused signal, such as ground, can be provided to the input Vu.

The well region of the memory core 120 is driven by the voltage control module 114 to a voltage $V_{WELL}$ based upon the operation being performed. The common source interconnect is driven by the voltage control module 114 to a voltage Vcs based upon an operation being performed.

Signal select sub-modules that are connected to local bit line interconnects, such as signal select sub-module 511, each have a select input, labeled "SEL," and a tri-state enable input, labeled, "Z," that are connected to the column decode module 116. The tri-state enable signal of a specific signal select module will be asserted in response to the column decode module determining, based on the ADDRESS, OPERATION/CONTROL, and DATA signals, that an interconnect connected to the specific signal select module is to be placed in a high impedance state. Note, that the DATA signal can be used to indicate which row of select gates are to be erased by asserting the tri-state enable signal only at those signal select sub-modules connected to rows of select gates that are to be erased.

When the output of the signal select module is to provide a voltage signal, i.e., not be tri-stated, the tri-state enable signal is negated, and a select signal at the SEL input selects between a signal at its select voltage input, Vs, and a signal at its unselected voltage input, Vu, based on the ADDRESS, OPERATION/CONTROL, and DATA signals. The select signal at input Vs is selected at those signal select sub-modules that are connected to a selected row of NAND strings, and the signal at input Vu is selected at those signal select sub-modules that are connected to unselected rows of NAND strings.

Signal select sub-modules that are connected to select drain gate interconnects, such as signal select sub-module 512, each have a select input, labeled "SEL," and a tri-state enable input, labeled, "Z," that are connected to the row decode sub-module 116. The tri-state enable signal of a specific signal select sub-module will be asserted in response to the column decode module determining, based on the ADDRESS, OPERATION/CONTROL, and DATA signals, that an interconnect connected to the output of specific signal select module is to be placed in a high impedance state.

When the row decode module 112 determines that an output of a signal select sub-module is to provide a voltage signal, as opposed to being tri-stated, the tri-state enable signal to that signal select module is negated and a select signal is provided from the row decode sub-module 112 to the input SEL of the signal select module to select one of the signals provided to either input Vs or input Vu. The signals provided from row decode sub-module 112 to the SEL inputs are based on a decode of the ADDRESS and OPERATION/CONTROL signals, and provide an appropriate voltage to a respective NAND string in accordance with the signals indicated at the table of FIG. 4. It will be appreciated that the ability to read select gates of a NAND Flash provides the ability to adjust the voltage thresholds of the select gates to overcome differences in voltage thresholds that can occur between select gates of the same row and column. The ability to adjust the voltage thresholds to be within an acceptable tolerance of each other allows for higher processing yields, and a higher level of reliability.

In the foregoing specification, principles of the invention have been described above in connection with specific embodiments. However, one of ordinary skill in the art appreciates that one or more modifications or one or more other changes can be made to any one or more of the embodiments without departing from the scope of the invention as set forth in the claims below. For example, specific voltage ranges have been described with can vary based upon the specific technology being used. The specific read technique describes generally assumes that a bit line is precharged and current flow from the bit line can be sensed during read operations. However, it will be appreciated that other techniques can be used to sense the state of a NAND storage cell. The techniques described herein have been described with respect to using N-channel transistors. It will be appreciate, however, that similar techniques can be applied to P-channel transistor by using signal values to control P-channel transistors devices in a similar manner. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

Other embodiments, uses, and advantages of the present disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A method comprising:
    adjusting a voltage threshold of a first select gate of a first NAND string electrically connected to a first bit line, the first NAND string comprising a plurality of NAND storage gates including two outer NAND storage gates, NAND[0] and NAND[N], and a plurality of inner NAND storage gates, N[1]-N[N−1], between the two outer NAND storage gates, where NAND[0] is the outer NAND storage gate of the NAND string most closely coupled to the first bit line and NAND[N] is the outer NAND storage gate of the NAND string least closely coupled to the first bit line, and wherein NAND[0] is coupled in series between the first select gate and an interior NAND storage gate, NAND[I], where I is an integer between 1 and N−1, and wherein adjusting comprises one of adjusting the voltage threshold by increasing a relative number of primary carriers at a charge storage location of the first select gate, or decreasing the relative number of primary carriers.

2. The method of claim 1 wherein adjusting comprises increasing the relative number of primary carriers.

3. The method of claim 2, wherein electrons are the primary charge carrier.

4. The method of claim 1 wherein adjusting comprises decreasing the relative number of primary carriers.

5. The method of claim 4, wherein electrons are the primary charge carrier.

6. The method of claim 1 further comprising simultaneously adjusting at the same time as the Vt of the first select gate a voltage threshold of a second select gate of the first NAND string by increasing the relative number of primary carriers at a charge storage location of the second select gate, wherein the primary carriers are of the type used to erase the storage gate NAND[0], and NAND[N] is coupled in series between the second select gate and the interior NAND storage gate.

7. The method of claim 1 comprising simultaneously adjusting at the same time as the voltage threshold of the first select gate a voltage threshold of a second select gate of the first NAND string, wherein NAND[N] is coupled in series between the second select gate and the interior NAND storage gate.

8. The method of claim 2, wherein holes are the primary charge carrier.

9. The method of claim 4, wherein holes are the primary charge carrier.

10. The method of claim 1 further comprising:
    providing a read voltage to a control electrode of the first select gate of a NAND string;
    determining a logic state of the first select gate based on the read voltage; and
    in response to the logic state not matching an expected logic state
    adjusting, in response to the logic state not matching an expected logic state, a voltage threshold of a first select gate of a first NAND string electrically connected to a first bit line, the first NAND string comprising a plurality of NAND storage gates including two outer NAND storage gates, NAND[0] and NAND[N], and a plurality of inner NAND storage gates, N[1]-N[N−1], between the two outer NAND storage gates, where NAND[0] is the outer NAND storage gate of the NAND string most closely coupled to the first bit line and NAND[N] is the outer NAND storage gate of the NAND string least closely coupled to the first bit line, and wherein NAND [0] is coupled in series between the first select gate and an interior NAND storage gate, NAND[I], where I is an integer between 1 and N−1.

11. The method of claim 10 further comprising:
    repeating providing, determining and adjusting the voltage threshold until the logic state matches the expected logic state.

12. The method of claim 10 wherein providing and determining are repeated to determine a voltage threshold value of the first select gate, and adjusting the voltage threshold includes adjusting the voltage threshold in response to the voltage threshold value being outside an expected range.

13. The method of claim 10 wherein adjusting comprises adjusting the voltage threshold of the first select gate to be closer to ground.

14. The method of claim 10 wherein adjusting comprises adjusting the voltage threshold of the first select gate to be further from ground.

15. The method of claim 10 wherein adjusting comprises adjusting the voltage threshold by increasing a relative number of primary carriers at a charge storage location of the first select gate.

16. The method of claim 10 wherein adjusting comprises adjusting the voltage threshold by decreasing a relative number of primary carriers at a charge storage location of the first select gate.

17. The method of claim 10 wherein NAND[0] is coupled in series between the first select gate and the interior NAND storage gate.

18. The method of claim 10 wherein NAND[N] is coupled in series between the first select gate and the interior NAND storage gate.

19. A method comprising:
    adjusting a voltage threshold of a first select gate of a first NAND electrically connected to a first bit line, the first NAND string comprising a plurality of NAND storage gates including two outer NAND storage gates, NAND [0] and NAND[N], and a plurality of inner NAND storage gates, N[1]-N[N−1], between the two outer NAND storage gates, where NAND[0] is the outer NAND storage gate of the NAND string most closely coupled to the first bit line and NAND[N] is the outer NAND storage gate of the NAND string least closely coupled to the first bit line, and wherein NAND[0] is coupled in series between the first select gate and an interior NAND storage gate, NAND[I], where I is an integer between 1 and N−1.

20. A method comprising:

adjusting a voltage threshold of a first select gate of a first NAND string connected to one of a first bit line or a common source line, the first NAND string comprising a plurality of NAND storage gates including two outer NAND storage gates, NAND[0] and NAND[N], and a plurality of inner NAND storage gates, N[1]-N[N−1], between the two outer NAND storage gates, where NAND[0] is the outer NAND storage gate of the NAND string most closely coupled to the first bit line and NAND[N] is the outer NAND storage gate of the NAND string least closely coupled to the first bit line, and wherein one of the two outer NAND storage gates is coupled in series between the first select gate and an interior NAND storage gate, NAND[I], where I is an integer between 1 and N−1.

* * * * *